United States Patent [19]
Premlatha et al.

[11] Patent Number: 5,385,804
[45] Date of Patent: Jan. 31, 1995

[54] SILICON CONTAINING NEGATIVE RESIST FOR DUV, I-LINE OR E-BEAM LITHOGRAPHY COMPRISING AN AROMATIC AZIDE SIDE GROUP IN THE POLYSILSESQUIOXANE POLYMER

[75] Inventors: Jagannathan Premlatha, Patterson; Harbans S. Sachdev, Hopewell Junction; Ratnam Sooriyakumaran, Fishkill, all of N.Y.

[73] Assignee: International Business Machines Corporation, Armonk, N.Y.

[21] Appl. No.: 932,830

[22] Filed: Aug. 20, 1992

[51] Int. Cl.$^6$ .................................... G03F 7/012
[52] U.S. Cl. ................................ 430/195; 430/167; 430/197; 528/43
[58] Field of Search ............... 430/195, 197, 270, 167; 528/43

[56] References Cited

U.S. PATENT DOCUMENTS

| | | | |
|---|---|---|---|
| 4,702,990 | 10/1987 | Tanaka et al. | 430/197 |
| 4,745,169 | 5/1988 | Sugiyama | 528/43 |
| 4,822,716 | 4/1989 | Onishi et al. | 430/192 |

FOREIGN PATENT DOCUMENTS

| | | | |
|---|---|---|---|
| 61-20030 | 1/1986 | Japan | 430/195 |
| 63-301913 | 12/1988 | Japan | 430/195 |
| 3144648 | 6/1991 | Japan | 430/195 |

*Primary Examiner*—Charles L. Bowers, Jr.
*Assistant Examiner*—John S. Chu
*Attorney, Agent, or Firm*—Whitham, Curtis, Whitham & McGinn

[57] ABSTRACT

A silicon-containing negative photoresist is used as the top imaging layer in a bilayer substrate patterning scheme. The photoresist is a single component resist in which the photoactive element is chemically bonded to the base polymer. In particular, an aromatic azide containing group is covalently bonded to the phenolic group of the poly(4-hydroxybenzyl)silsesquioxane (PHBS) via an esterification reaction. The new photoresist is easily synthesized and has the advantageous properties of aqueous base developability, excellent $O_2$ RIE resistance, and high sensitivity to DUV, I-line and E-beam exposures.

3 Claims, 3 Drawing Sheets a b c

SILICON CONTAINING NEGATIVE RESIST FOR DUV, I-LINE OR E-BEAM LITHOGRAPHY COMPRISING AN AROMATIC AZIDE SIDE GROUP IN THE POLYSILSESQUIOXANE POLYMER

BACKGROUND OF THE INVENTION

Field of the Invention

The present invention is generally related to a negative photoresist that can be used as the top imaging layer in a bilayer scheme and, more particularly, to a silicon-containing negative photoresist in which the photoactive element is chemically bonded to the base polymer.

Description of the Prior Art

The increasing use of high density integrated circuits has created a need for process simplification in semiconductor device fabrication in order to reduce material and labor costs and to achieve lower defect levels and improved product reliability.

FIG. 1 shows the steps in a common semiconductor trilayer process which employs a reactive ion etch (RIE) barrier layer and a negative photoresist. First, a polymer 10, such as a baked novolac, is applied to a substrate 12. A silicon-containing RIE barrier layer 14, such as silicon nitride ($Si_3N_4$), silicon dioxide ($SiO_2$), or plasma or solution deposited organosilicon, is applied over the polymer 10. Finally, a photoresist layer 16 is applied to the top to complete the trilayer structure. The polymer 10, reactive ion etch (RIE) barrier layer 14, and photoresist layer 16 can be applied by many well-known techniques including using a plasma tool or by spinning procedures. The photoresist layer 16 is then patterned by imaging and developing or by other suitable techniques. FIG. 1 shows deep ultraviolet (DUV) light 15 impinging on areas 11 of the photoresist layer 16; however, many other imaging techniques, such as I-line and E-beam lithography, could be used. In the case of a negative resist, the exposed areas 11 become less soluble than the unexposed areas 13. These areas 11 are removed during development to produce a negative mask pattern 19. The pattern serves as a stencil for etching the RIE barrier layer 14 and the underlying polymer 10. Transfer of the pattern 19 can be accomplished by using $CF_6$ RIE to etch the RIE barrier layer 14 and $O_2$ RIE to etch the underlying polymer. During $O_2$ RIE, the photoresist layer 16 may erode away; however, the RIE barrier layer 14 remaining under the photoresist layer 16 will protect the underlying substrate 12. A blanket layer of metal 20 is then deposited over the structure 21 by evaporation or by other suitable techniques, with the trilayer stacks serving as a stencil. Finally, the trilayer stacks are removed by dissolving the polymer 10 with an appropriate solvent.

FIG. 2 shows the process steps in another prior art method known as silylation of the imaged resist (SIR). Unlike the trilayer process, the SIR process only requires the deposition of a polymer 22, such as a soluble polyimide or a hard baked novolak, and a photoresist 24 on top of the substrate 26. The photoresist 24 is then patterned by conventional imaging and developing techniques. Before the pattern 29 is transferred to the substrate 26, the photoresist 24 is converted to an RIE barrier layer via silylation. During silylation, the photoresist 24 is exposed to silicon-containing vapors of hexamethyldisilazane (HMDS) or the like. This causes silicon to become incorporated into the photoresist 24. The converted photoresist 25 then serves as a suitable stencil for patterning the substrate 26 in the same manner described in conjunction with the trilayer process, except that only an $O_2$ RIE etch is required. As can be seen from FIG. 2, a blanket layer of metal 30 is deposited on the structure 31 with the bilayer stacks of converted photoresist 25 and polymer 22 serving as a stencil. Subsequently, the bilayer stacks are removed by dissolving the lift-off polymer 22.

A major drawback of the silylation technique is that some silicon becomes incorporated into areas 27 where it is not needed. Because the silicon prevents etching, a residue is left in areas 23 where complete etching is desired. In addition, the silylation process causes swelling of negative resists which limits resist resolution. For example, two adjacent lines of resist may swell enough that they touch. On shrinking in the rinse, they may not completely separate, leaving bridges. The expansion and contraction weakens adhesion of very small resist features to the substrate and can cause small undulations in narrow (0.5 $\mu$m) lines. This problem becomes less severe as resist thickness is reduced. Conversely, there is a need for a certain minimum thickness in order to keep defect density sufficiently low while maintaining resistance to oxygen etching in device processing.

To achieve high resolution with improved dimensional control, bilevel or multilevel resist systems are often utilized. A typical bilevel system is shown in FIG. 3. A bottom layer 31 is first applied on the substrate 33 and cured to planarize wafer topography. It is selected from a group of materials which are either insoluble in the solvent used for applying the silicon containing resist or are rendered insoluble by high temperature bake. Novolak-diazoquinone resists and polyimides are typical examples of materials suitable for use as the bottom layer 31. In the case of novolak-diazoquinone resist, after application, the coated substrate is sequentially baked at 90° C. for ten minutes and at 230° C. for thirty minutes before applying the silicon containing resist. Alternatively, a polyimide coating is applied from N-methylpyrolidone (NMP) or $\gamma$-butyrolactone solvents and baked as described above. A second thinner imaging top resist 35 is then applied over the bottom layer 31. The top resist 35 is soft baked and a pattern 37 formed using conventional resist development, followed by RIE pattern transfer to the bottom layer 31 using the top resist pattern 37 as a mask. Most photoresists utilized in bilayer processing techniques are silicon-containing derivatives of conventional lithographic materials such as chlorinated or chloro methylated styrenes, hydroxy styrenes, methacrylate derivatives or novolac resins with a photosensitive compound added as a separate component or incorporated into the polymer chain.

SUMMARY OF THE INVENTION

It is an object of this invention to provide a new negative photoresist that can be developed with aqueous base which includes silicon in the base polymer and has a photoactive moiety chemically bonded to the base polymer.

According to the invention, single component silicon-containing polymers are synthesized by covalently bonding an azide group carrying carboxylic acid to the poly(4-hydroxybenzyl) silsesquioxane (PHBS) polymer. The resultant negative tone resist materials are aqueous base developable, have excellent O₂ RIE resistance, and a high sensitivity compatible with excimer laser exposure tool throughput requirements. The resist materials are most preferably applied as the top layer in a bilayer resist scheme. The underlayer may be a polyimide or a hard baked novolac resin. The resists may be patterned using both DUV and E-beam exposure tools. In addition, the resists may be combined with a sensitizer, such as anthracene methanol, to allow exposures with I-line radiation.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF A PREFERRED EMBODIMENT OF THE INVENTION

Figure 1:
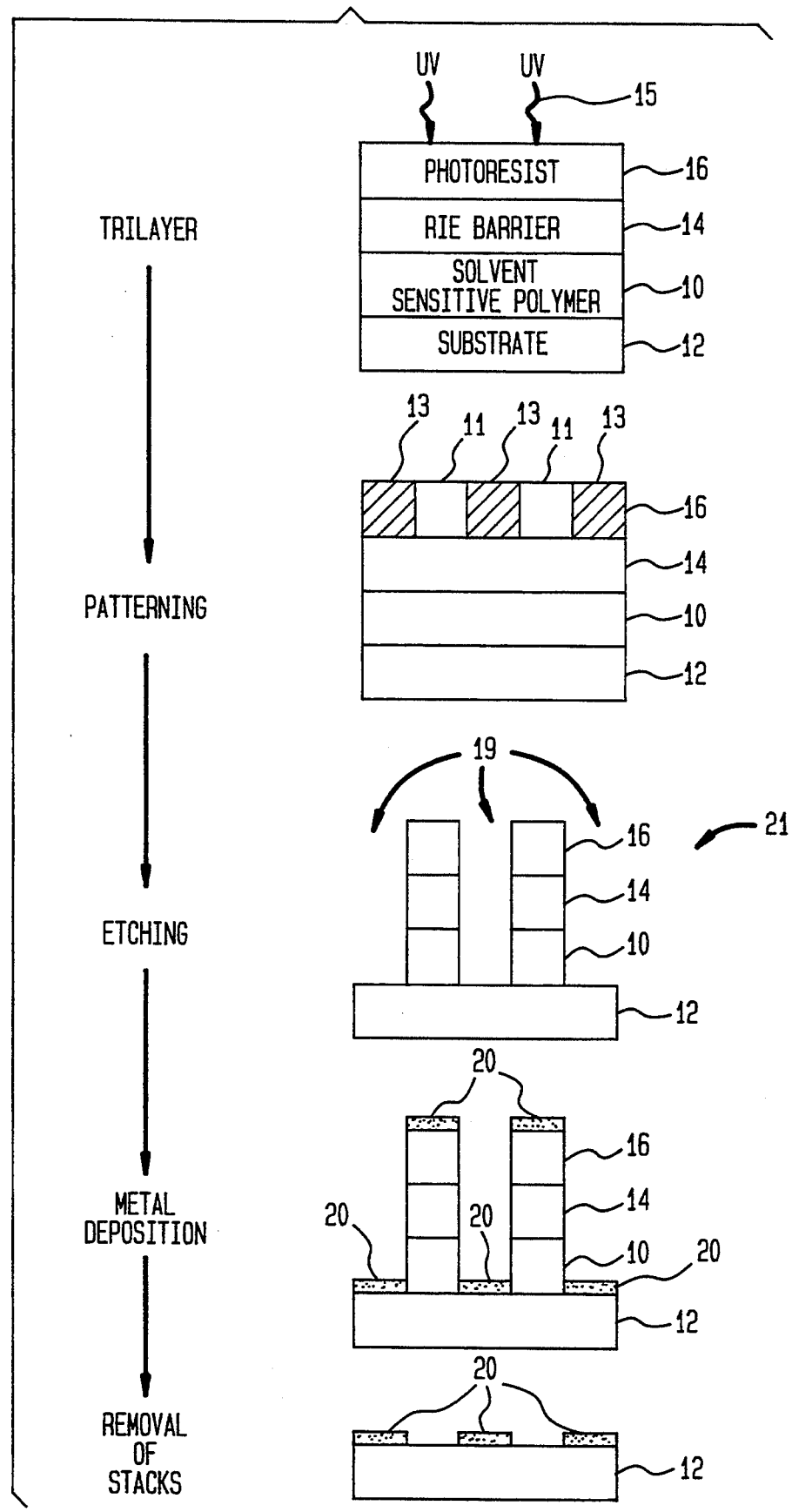
FIG. 1 shows cross-sectional sideviews of a wafer during a common trilayer process.
Figure 2:
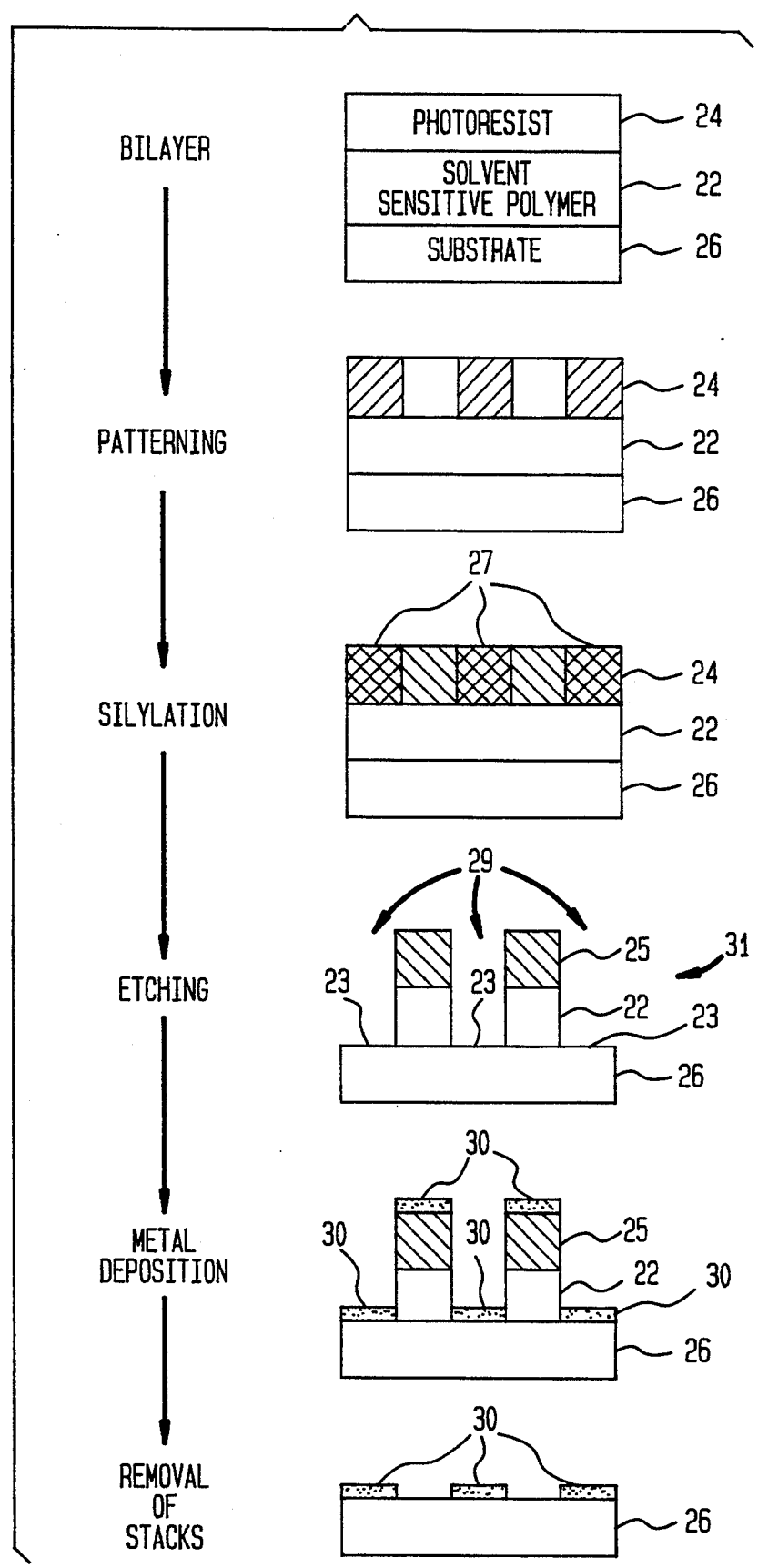
FIG. 2 shows cross-sectional sideviews of a wafer during a silylation (SIR) process; and wafer during a silylation (SIR) process.
Figure 3:
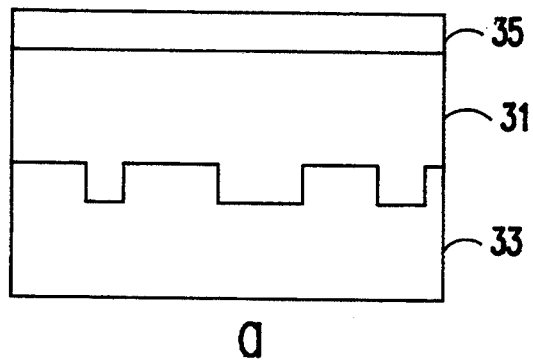
FIG. 3 is a cross-sectional sideview of a wafer in a typical bilevel scheme.
Figure 3:
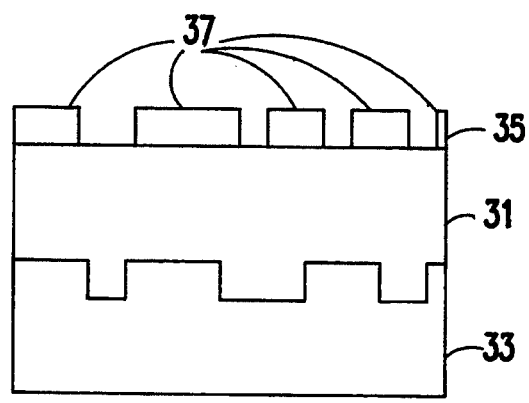
Figure 3:
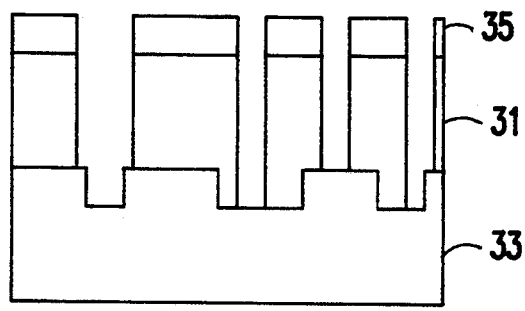

The negative photoresists of the present invention comprise azide functionalized silicon-containing polymers in which a photoactive element is chemically bonded to the backbone of the base polymer, PHBS. Synthesis of the polymers is achieved by an esterification reaction of an aromatic azide carrying carboxylic acid group with the phenolic group of the PHBS polymer as shown below:

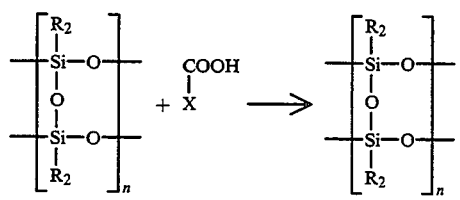

where R₁ has the following structure:

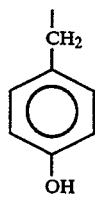

and R₂ has the following structures:

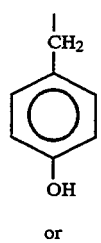

or

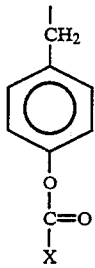

(2)

where the ratio of structure (1) to structure (2) on the polymer backbone ranges between 95:5 and 5:95, and is most preferably 75:25 (1):(2), and where X, which is shown as part of a carboxylic acid in the reaction sequence and is shown connected through an ester linkage to the phenolic group in structure (2), is an aromatic azide containing group, and where the number of repeat units n is at least three. Suitable aromatic azide containing groups X include the following structures:

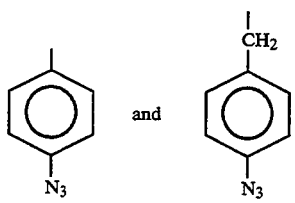

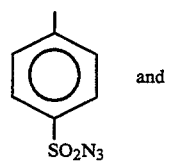

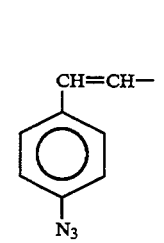

Esterification is accomplished at an ambient temperature in an ether solvent, such as tetrahydrofuran (THF), in the presence of a condensation reagent. The reaction solvent is evaporated and the product is taken up in methanol and any unreacted carboxylic acid is removed by treatment with a strongly basic ion exchange resin such as IRN-78, which is commercially available through Poly Sciences. The polymers are further purified by precipitation from deionized water and dried. Syntheses of exemplary polymers using specific azide compounds are more fully described in Examples 1–4. However, it is anticipated that other aromatic azide compounds may be covalently bonded to PHBS by an esterification reaction to produce similar negative tone resists.

PHBS may be synthesized by various prior art processes such as the method disclosed in U.S. Pat. No. 4,745,169. However, PHBS is most preferably synthesized in accordance with the method disclosed by Hefferon et al., *Method for Synthesis of Alkali Soluble Silsesquioxane Polymers*, IBM Technical Disclosure Bulletin, Vol. 34, No. 4B, 313 (September, 1991), in which methoxybenzyl polymer is reacted with boron tribromide to replace the methyl groups with hydrogens.

The azide functionalized silicon-containing polymers may be used in solution directly to provide aqueous base developable single-component negative tone resists that exhibit the high sensitivity compatible with excimer laser tool throughput requirements. The resist materials contain approximately 15% silicon which provides good $O_2RIE$ resistance. Images down to 0.4 $\mu$m feature size have been resolved and transferred to a 1 $\mu$m underlayer of DuPont PI 2566, a polyimide, by $O_2RIE$. Exposures to E-beam sources at 7 $\mu C/cm^2$ at 50 KeV extend the resolution to 0.25 micron features. The resists have a contrast of 4.5 when measured over a silicon substrate. The etch ratio is 1:23, which indicates that pattern transfer to thicker underlayers is readily accomplished (the etch ratio compares the rate at which silicon will be eroded versus the rate at which the underlayer is eroded and is a measure of the ability to transfer a pattern to the underlayers).

In one embodiment of the invention, a bilevel resist is prepared as follows: A1100 primer, which is commercially available through Ciba-Geigy or Aldrich Chemical Company, is applied to the silicon wafer by spinning at 3000 rpm for 2 minutes. A 1 $\mu$m thick layer of a polyimide, such as DuPont PI 2566, is then applied at a spin speed of 4000 rpm for 1 minute. Alternatively, XU293, a soluble polyimide which is available through Ciba-Geigy, may be used. The polyimide underlayer is oven baked at 90° C. for 10 minutes to remove the solvent, followed by a hard bake at 230° C. for 30 minutes. The azide functionalized silicon-containing resist is then spin applied at 4000 rpm for 30 seconds onto the hardened polyimide underlayer to obtain a 0.3 $\mu$m thick film. The resist comprises 20% by weight of the azide-carrying polymer in 80% by weight of the solvent, propylene glycol monomethyl ether acetate (PMA). It should be understood that other solvents could be used and that different concentrations of solvent could be used. Here the solvent is serving the function of transporting the new resist onto a substrate and allowing it to spread evenly over the substrate via a spin procedure. The wafer is baked at 90° C. for 2 minutes on a hot plate. The resist is then patterned using DUV or E-beam exposure tools. For example a Canon stepper (248 nm) may be utilized at an exposure of 25–30 $mJ/cm^2$. Patterning is followed by a post exposure bake at 90° C. for 2 minutes on a hot plate. The film is developed in 0.21N tetramethyl ammonium hydroxide (TMAH) for 1 minute and the patterns are transferred to the underlayer using an Applied Materials reactive ion etch (RIE) tool, AME-5000, using oxygen gas for RIE.

In another embodiment of the invention, a bilevel resist is prepared by applying a layer of A1100 primer to a wafer and then spin applying a 1 $\mu$m thick film of a novolac-based resist, such as an AZ resist, on the wafer. The wafer is baked in an oven at 90° C. for 10 minutes and then hard baked at 230° C. for 30 minutes to crosslink the resist underlayer. The resist formulation of the present invention is then spin applied at 4000 rpm for 30 seconds onto the hardened underlayer to obtain a 0.3 $\mu$m thick film. The resist is applied as a solution comprising 20% by weight of the azide-carrying polymer in PMA. The wafer is baked at 90° C. for 2 minutes on a hot plate followed by patterning using DUV or E-beam exposure tools and a post exposure bake at 90° C. for 2 minutes on a hot plate. The film is developed in 0.21N tetramethyl ammonium hydroxide (TMAH) for 1 minute and the patterns are transferred to the underlayer by $O_2RIE$.

In yet another embodiment of the invention, the photoresist formulations are prepared for exposures with I-line (365 nm) radiation as follows: the azide carrying polymer is formulated with 1–5%, most preferably 4%, by weight of total solids of a sensitizer, such as anthracene methanol. A typical formulation having 20% by weight total solids comprises 19.2 parts by weight of the azide carrying polymer and 0.8 parts by weight of the sensitizer anthracene methanol dissolved in 80 parts by weight of the solvent PMA. The resist formulation is spin applied at 4000 rpm for 30 seconds onto a hardened resist underlayer comprising a polyimide or novolac based resist to obtain a 0.3 $\mu$m thick film. The wafer is baked at 90° C. for 2 minutes on a hot plate. Exposure to 365 nm radiation produces negative tone images which are developed with aqueous TMAH solution and then transferred to the underlying polyimide layer by $O_2$ RIE.

EXAMPLE 1

4.075 grams (0.0275M) of p-azido benzoic acid is dissolved in a flask containing 100 ml of anhydrous THF. 4.05 grams (0.025M) of 1,1'carbonyldiimidazole is then added and the solution is stirred at room temperature under an Argon atmosphere for 2 hours. A solution of 15.9 grams (0.1M) of PHBS in 50 ml of anhydrous THF is added to the flask. Stirring is continued for 10 hours, after which time the solution is filtered and the solvent is removed by rotary evaporation. The remaining residue is then redissolved in methanol and combined with 1–5 grams of IRN-78. The solution is stirred for 5 minutes to remove any unreacted azido benzoic acid, then filtered and added dropwise to a large excess of deionized water to cause the polymer to precipitate. The precipitated polymer is filtered and air dried to yield the corresponding azido benzoate derivative of PHBS.

EXAMPLE 2

4.86 grams (0.0275M) of p-azido phenyl acetic acid is dissolved in a flask containing 100 ml of anhydrous THF. 4.05 grams (0.025M) of 1,1'carbonyldiimidazole is then added and the solution is stirred at room temperature under an Argon atmosphere for 2 hours. A solution of 15.9 grams (0.1M) of PHBS in 50 ml of anhydrous THF is added to the flask. Stirring is continued for 10 hours, after which time the solution is filtered and the solvent is removed by rotary evaporation. The remaining residue is then redissolved in methanol and combined with 1–5 grams of IRN-78. The solution is stirred for 5 minutes to remove any unreacted azido phenyl acetic acid, then filtered and added dropwise to a large excess of deionized water to cause the polymer to precipitate. The precipitated polymer is filtered and air dried to yield the corresponding azido phenyl acetate derivative of PHBS.

EXAMPLE 3

6.24 grams (0.0275M) of p-azido sulfonyl benzoic acid is dissolved in a flask containing 100 ml of anhydrous THF. 4.05 grams (0.025M) of 1,1'carbonyldiimidazole is then added and the solution is stirred at room temperature under an Argon atmosphere for 2 hours. A solution of 15.9 grams (0.1M) of PHBS in 50 ml of anhydrous THF is added to the flask. Stirring is continued for 10 hours, after which time the solution is filtered and the solvent is removed by rotary evaporation. The remaining residue is then redissolved in methanol and combined with 1-5 grams of IRN-78. The solution is stirred for 5 minutes to remove any unreacted azido sulfonyl benzoic acid, then filtered and added dropwise to a large excess of deionized water to cause the polymer to precipitate. The precipitated polymer is filtered and air dried to yield the corresponding azido sulfonyl benzoate derivative of PHBS.

EXAMPLE 4

5.19 grams (0.0275M) p-azido cinnamic acid is dissolved in a flask containing 100 ml of anhydrous THF. 4.05 grams (0.025M) of 1,1′carbonyldiimidazole is then added and the solution is stirred at room temperature under an Argon atmosphere for 2 hours. A solution of 15.9 grams (0.1M) of PHBS in 50 ml of anhydrous THF is added to the flask. Stirring is continued for 10 hours, after which time the solution is filtered and the solvent is removed by rotary evaporation. The remaining residue is then redissolved in methanol and combined with 1-5 grams of IRN-78. The solution is stirred for 5 minutes to remove any unreacted azido cinnamic acid, then filtered and added dropwise to a large excess of deionized water to cause the polymer to precipitate. The precipitated polymer is filtered and air dried to yield the corresponding p-azido cinnamate ester of PHBS.

While in the preferred embodiments, a resist is applied in a bilayer system, it should be recognized that the resist may also be utilized in single or multilayer systems. In addition, while the preferred embodiments for synthesis of the azido functionalized polymers utilize carbonyl diimidazole, it should be recognized that other derivatives of phosgene could also be used. Other modifications to the synthesis procedures and use of the new resists could be implemented.

While the invention has been described in terms of its preferred embodiments, those skilled in the art will recognize that the invention can be practiced with considerable variation within the spirit and scope of the appended claims.

Having thus described our invention, what we claim as new and desire to secure by Letters Patent is as follows:

1. A photoresist composition, comprising:
   a solvent present together in admixture in said photoresist composition at more than 50% by weight; and
   a condensation product of a polymer having the formula:

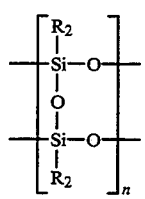

where n is at least three and where $R_2$ has the chemical formula:

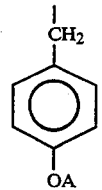

where A is hydrogen or an ester of an aromatic azide wherein the esterification rate is 5%-95%.

2. The photoresist of claim 1 wherein said ester of an aromatic azide has a chemical formula selected from the group consisting of:

(1)

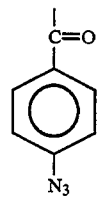

(2)

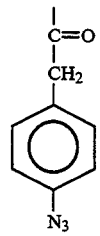

(3)

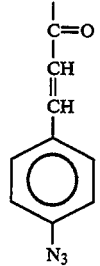

and (4)

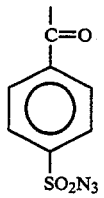

3. The photoresist composition of claim 1 further comprising a sensitizer in admixture with said solvent and said polymer.

* * * * *

UNITED STATES PATENT AND TRADEMARK OFFICE
CERTIFICATE OF CORRECTION

PATENT NO. : 5,385,804
DATED : January 31, 1995
INVENTOR(S) : Premlatha Jagannathan, Harbans S. Sachdev, Ratnam Sooriyakumaran It is certified that error appears in the above-indentified patent and that said Letters Patent is hereby corrected as shown below:

On the title page, item [19] should read --Jagannathan, et al--.
On the title page, item [75], Inventors, delete "Jagannathan Premlatha" and substitute therefore -- Premlatha Jagannathan --.

Signed and Sealed this

Fifteenth Day of October, 1996

Attest:

BRUCE LEHMAN

*Attesting Officer*   *Commissioner of Patents and Trademarks*